US007013447B2

(12) United States Patent
Mathew et al.

(10) Patent No.: US 7,013,447 B2
(45) Date of Patent: Mar. 14, 2006

(54) METHOD FOR CONVERTING A PLANAR TRANSISTOR DESIGN TO A VERTICAL DOUBLE GATE TRANSISTOR DESIGN

(75) Inventors: Leo Mathew, Austin, TX (US); Byoung W. Min, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 179 days.

(21) Appl. No.: 10/624,398

(22) Filed: Jul. 22, 2003

(65) Prior Publication Data

US 2005/0020015 A1    Jan. 27, 2005

(51) Int. Cl.
*G06F 17/50* (2006.01)
(52) U.S. Cl. .................. 716/11; 716/2; 716/8
(58) Field of Classification Search .......... 716/8–11, 716/21; 438/164, 284, 277, 300; 257/66, 257/270, 365
See application file for complete search history.

(56) References Cited

U.S. PATENT DOCUMENTS

| | | | | |
|---|---|---|---|---|
| 6,189,136 | B1 * | 2/2001 | Bothra ........................ | 716/21 |
| 6,691,297 | B1 * | 2/2004 | Misaka et al. ................ | 716/21 |
| 6,807,662 | B1 * | 10/2004 | Toublan et al. ............... | 716/21 |
| 2004/0117748 | A1 * | 6/2004 | Tester ........................... | 716/11 |
| 2004/0266115 | A1 * | 12/2004 | Chan et al. ................... | 438/284 |
| 2005/0001216 | A1 * | 1/2005 | Adkisson et al. ............. | 257/66 |
| 2005/0020020 | A1 * | 1/2005 | Collaert et al. ............. | 438/300 |

OTHER PUBLICATIONS

Geppert, "Momentum Builds for Multiple-Gate Transistors," IEEE, Spectrum, pp. 1-3 (2003).
Ohr, "FinFETs and InP Ics Vie for Dominance in Future Ics," Silicon Strategies, pp. 1-4 (2003).
Nowak et al., "A Functional FinFET-DGCMOS SRAM Cell," IEEE, 4 pgs., (2002).
Copy of related U.S. Appl. No. 10/074,732.

* cited by examiner

*Primary Examiner*—Vuthe Siek
(74) *Attorney, Agent, or Firm*—Daniel D. Hill; Joanna G. Chiu

(57) ABSTRACT

A method for creating a vertical double-gate transistor design includes providing a planar transistor layout (10) having a gate layer (12) overlying an active layer (14). In one embodiment, a first intermediate layer (18) is defined based on an overlapping region of the gate and active layers, and, using the first intermediate layer, a second intermediate layer (22) is defined which defines a spacing between at least two fins of the vertical double-gate transistor design. The second intermediate layer may also define a length and a width of the at least two fins. One embodiment modifies a dimension of the first intermediate layer prior to defining the second intermediate layer. The method further includes defining a resulting layer (24) based on a non-overlapping region of the second intermediate layer and the active layer. The resulting layer may then be used to create a mask and a semiconductor device (30) corresponding to the vertical double-gate transistor design.

18 Claims, 5 Drawing Sheets

LAYER 18 AND LAYER 20 = LAYER 22
10

ACTIVE 14 XOR LAYER 22 = LAYER 24
10

GATE 12 AND ACTIVE 14 = LAYER 18

OVERSIZE LAYER 18

GENERATE LAYER 20 BASED ON DIMENSIONS T, P, W, X, AND Y

LAYER 18 AND LAYER 20 = LAYER 22

ACTIVE 14 XOR LAYER 22 = LAYER 24

METHOD FOR CONVERTING A PLANAR TRANSISTOR DESIGN TO A VERTICAL DOUBLE GATE TRANSISTOR DESIGN

RELATED APPLICATIONS

This application is related to U.S. patent application Ser. No. 10/074,732, entitled "METHOD OF FORMING A VERTICAL DOUBLE GATE SEMICONDUCTOR DEVICE AND STRUCTURE THEREOF" filed Feb. 13, 2002, and assigned to the assignee hereof.

FIELD OF THE INVENTION

This invention relates generally to integrated circuit design, and more particularly, to a method for converting a planar transistor design to a vertical double gate transistor design.

BACKGROUND OF THE INVENTION

Traditionally, MOSFETs (metal oxide semiconductor field effect transistors) have been implemented with a single control electrode or gate on a planar substrate. The gate is placed between a source and drain electrode and functions to create a channel controlling the amount of current between the source and drain electrodes. Because there is only a single gate electrode to control the channel, the transistor may exhibit undesirable characteristics. For example, the planar transistor may suffer from certain short channel effects, where the drain electrode has an unwanted effect on the channel resulting in excessive leakage current.

A vertical double gate transistor design, also known as a finFET, has been proposed to eliminate some of the problems with single gate planar transistor design. In a vertical double gate transistor design, the channel consists of a pillar or slab, (the fin in finFET) that is oriented perpendicular to the plane of a substrate, but a line connecting the source and drain is parallel to the substrate plane. A gate material such as polysilicon or metal is formed on both sides of the fin. The double gate arrangement increases electrostatic coupling between the gates and the channel relative to the single gate design. Also, drive current is improved with decreased leakage. Because of the performance advantages offered by the use of vertical double gate transistors, it would be desirable to convert existing integrated circuit designs that use planar transistors. However, extensive layout/design changes may be necessary when converting a design using planar transistors to a design using vertical double gate transistors. Therefore, there is a need for a way to easily convert a planar transistor design to a vertical double gate transistor design.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the following drawings.

DETAILED DESCRIPTION OF A PREFERRED EMBODIMENT

Generally, the present invention provides a method for converting a planar transistor design to a vertical double gate transistor design. The method includes providing a planar transistor layout having a gate layer overlying an active layer. In one embodiment, a first intermediate layer is defined based on an overlapping region of the gate and active layers, and, using the first intermediate layer, a second intermediate layer is created which defines a spacing between at least two fins of the vertical double gate transistor design. The second intermediate layer may also define a length L and a width of the at least two fins. One embodiment modifies a dimension of the first intermediate layer prior to defining the second intermediate layer. The method further includes defining a resulting layer based on a non-overlapping region of the second intermediate layer and the active layer. The resulting layer may then be used to create a mask and a semiconductor device corresponding to the vertical double-gate transistor design.

In the illustrated embodiment, the method is implemented as software running on a data processing system.

Figure 1:
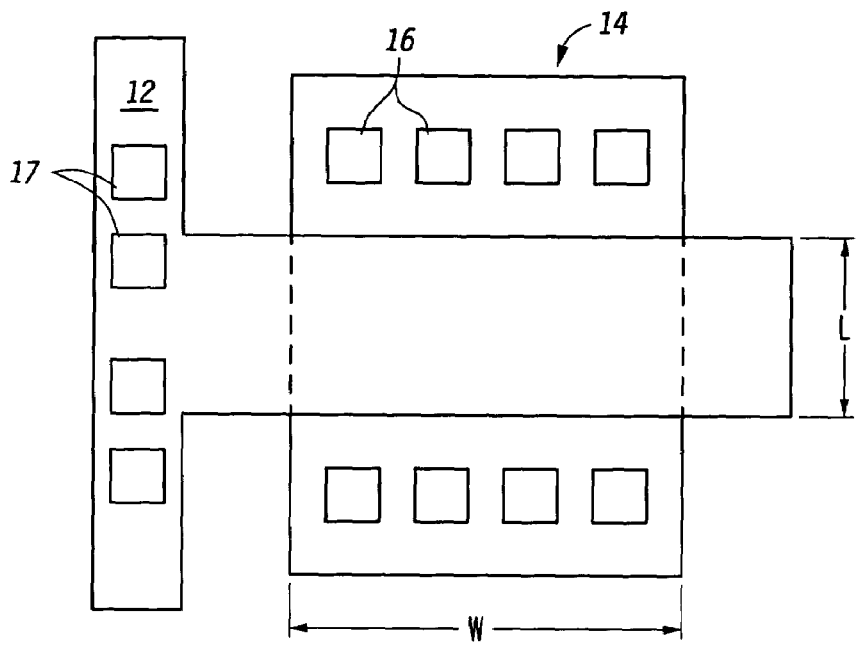
FIGS. 1–6 illustrate, in a top down view, a method for converting a planar transistor to a vertical double gate transistor in accordance with the present invention.

FIGS. 1–6 illustrate, in a top down view, a method for converting a planar transistor design to a vertical double gate transistor design in accordance with the present invention. Specifically, FIG. 1 illustrates a simplified layout 10 of a planar transistor design to be converted to a vertical double gate transistor design in accordance with the present invention. The layout 10 includes a gate layer 12 overlying an active layer 14. Gate layer 12 includes contacts 17 and the active layer 14 includes contacts 16. The number of contacts 16 and 17 may be different in other embodiments, and is not important for purposes of describing the invention. A channel region is formed where the gate layer 12 overlies the active layer 14. The channel region has a width labeled "W" and a length labeled "L". Note that the word "layer", as used herein in the discussion of FIGS. 1–6, is a set of coordinates representing a polygon in a data processing system. However, in FIGS. 7 and 8, the word "layer" is also used to describe a material structure in a semiconductor device.

Figure 2:
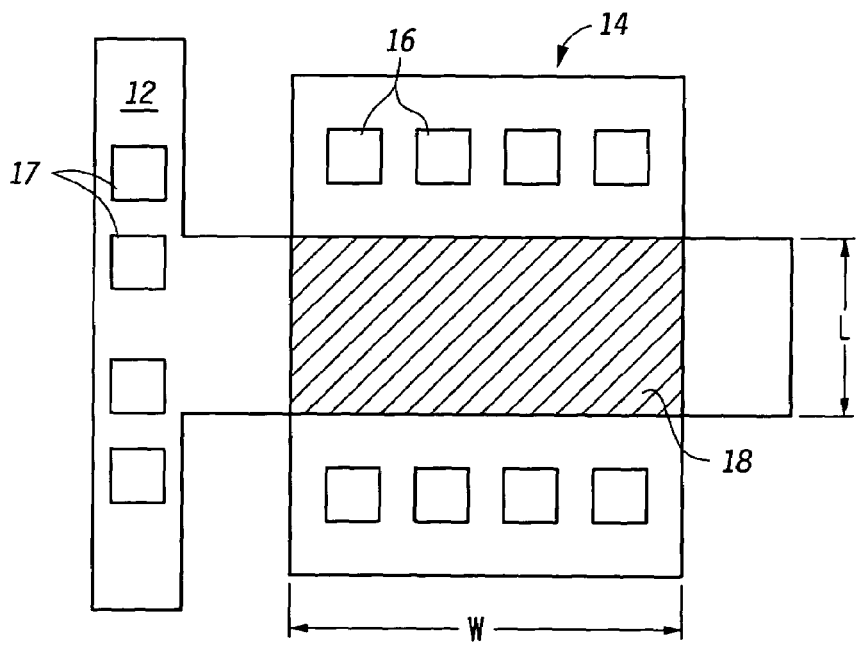

FIG. 2 illustrates a step of performing an AND logical operation of gate layer 12 and active layer 14 to produce an intermediate layer 18 (cross-hatched).

Figure 3:
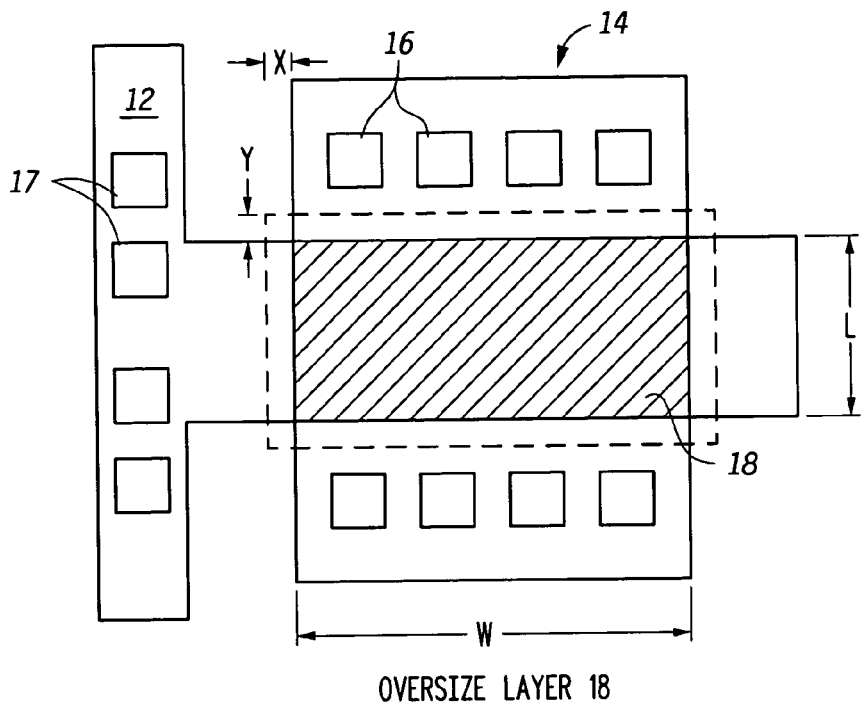

FIG. 3 illustrates a step of over sizing intermediate layer 18 by a value represented by "X" in the horizontal direction and represented by "Y" in the vertical direction. The value Y defines how far a fin extends beyond the gate. The value X may be adjusted as necessary to correct or optimize spacing considerations and the number of fins.

Figure 4:
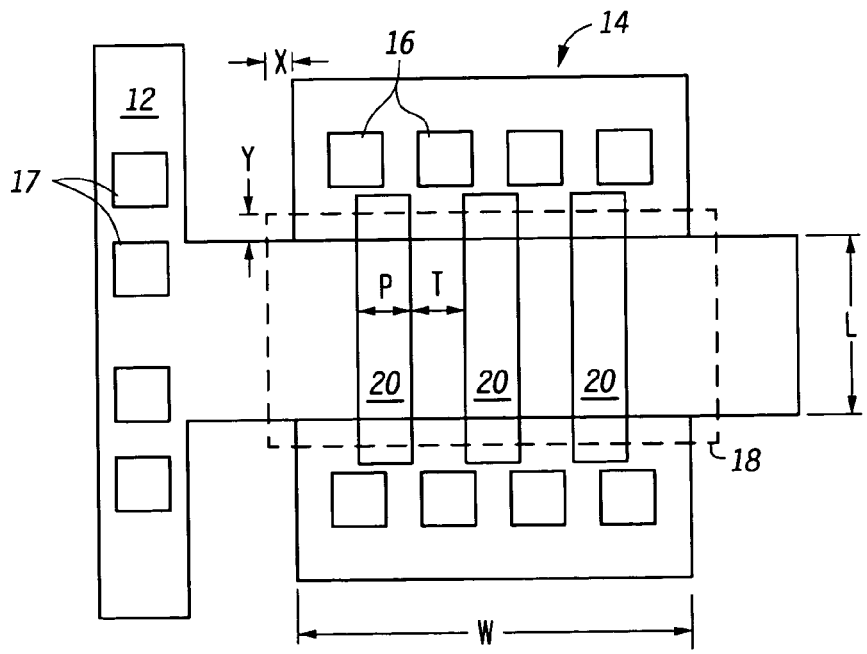

FIG. 4 illustrates a step of generating another intermediate layer 20 based on the dimensions T, P, W, X, and Y, where T defines a drawn dimension of the silicon fin, P defines the drawn pitch, or distance, between the fins. Generally, the dimension P is limited by the minimum pitch of the lithographic process tools (typically 100–200 nanometers). The dimension T is drawn to, for example, 100 nanometers, but with additional processing, such as trimming the silicon or resist, the final value for T may be 20–30 nanometers. In the illustrated embodiment, a length of the intermediate layer will be at least L+2Y.

Figure 5:
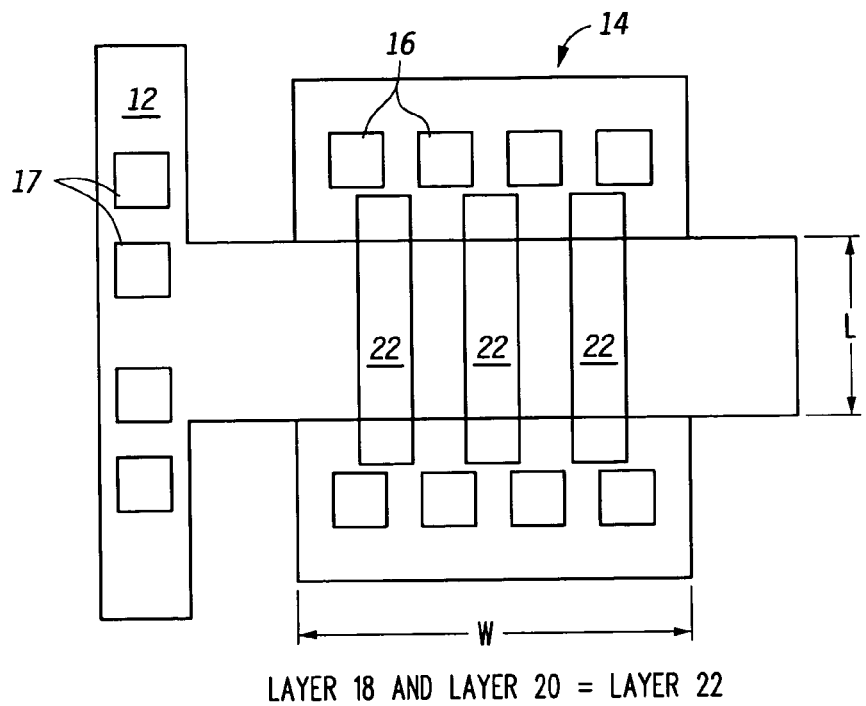

FIG. 5 illustrates a step of performing a logical AND operation of intermediate layer 18 and intermediate layer 20 to create layer 22. Layer 22 is based on overlapping intermediate layers 18 and 20 and defines spacing between at least two fins of the final vertical double gate transistor design.

Figure 6:
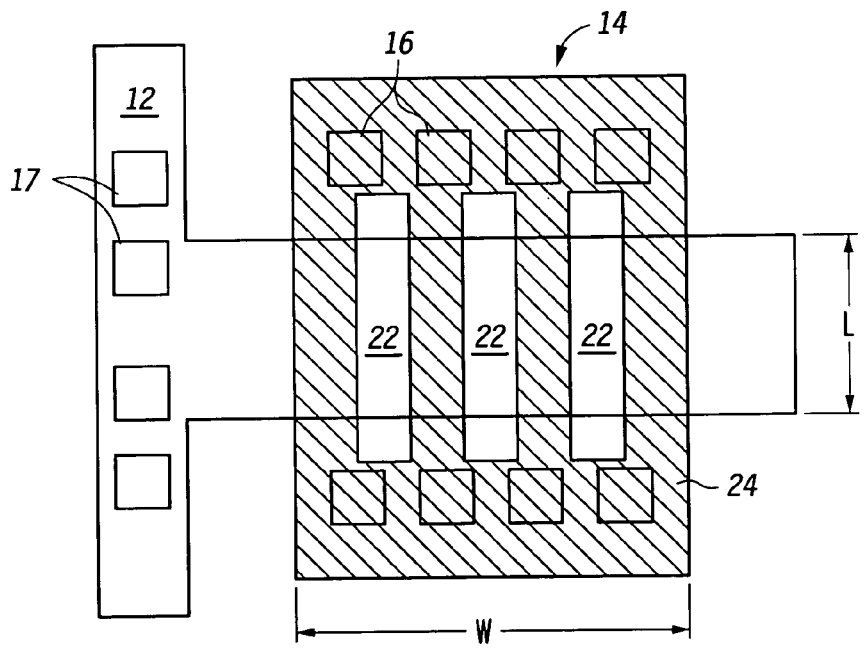

FIG. 6 illustrates a step of performing a logical exclusive-or (XOR) operation between active layer 14 and layer 22 to produce a resulting layer 24. The layer 24 is used for creating at least a portion of a photo mask used to manufacture a vertical double gate transistor design. The layer 22 is illustrated in FIG. 6 and corresponds to openings in a resulting photo mask. The above steps produce a mask that can be used with a positive resist. However, those skilled in the art will realize that the above steps can be modified to produce a mask that is used with a negative resist.

By using existing layers of the planar transistor to produce intermediate layers as discussed above in a data processing system, a planar transistor design can be easily converted to a vertical double gate transistor design. To take advantage of the performance benefits of the vertical double gate transistors, the resulting layout can be shrunk using transistor scaling techniques or rules.

Figure 7:
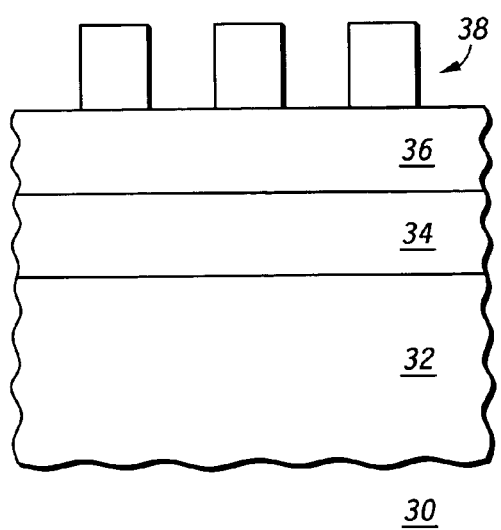
FIGS. 7–8 illustrate, in cross sectional views, a portion of a semiconductor device manufactured in accordance with the method of FIGS. 1–6.
Figure 8:
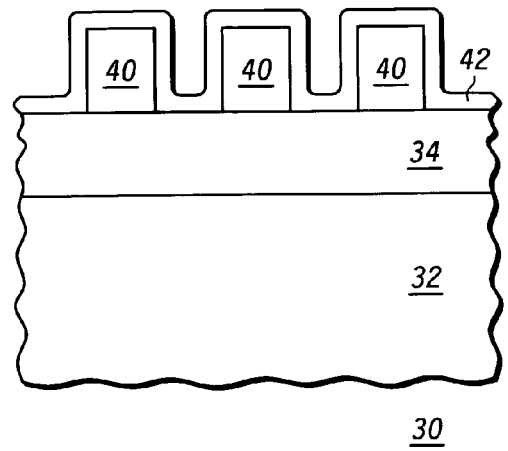

FIGS. 7–8 illustrate, in cross sectional views through a center region of the fins, a portion of a semiconductor device manufactured in accordance with the method of FIGS. 1–6.

Specifically, FIG. 7 illustrates a silicon-on-insulator (SOI) substrate having a silicon substrate 32, an oxide layer 34 formed thereon, and a silicon layer 36 formed on the oxide layer 34. Photo resist layer 38 is patterned using a mask created by performing the method described above with FIGS. 1–6.

FIG. 8 illustrates the channel region 40 (fins) produced by etching silicon layer 36 (FIG. 7) through the pattern created by photo resist layer 38. Photo resist layer 38 is removed. A gate stack 42 is formed over channel region 40. The gate stack 42 comprises gate electrodes and gate dielectrics. Note that the particular process steps for creating the gate stack 42 are not important for describing the invention and can be created a number of ways.

Figure 9:
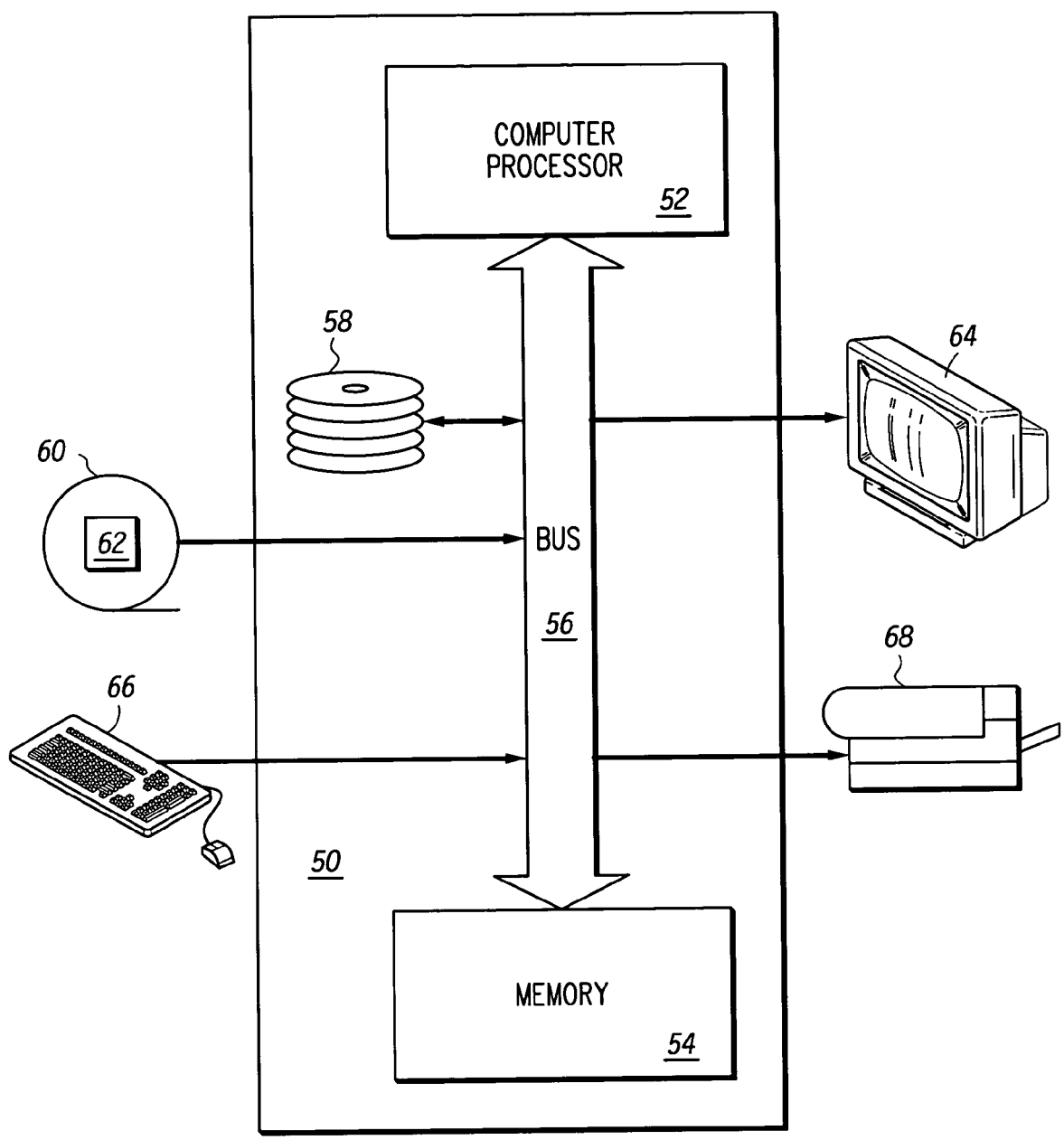
FIG. 9 illustrates a data processing system for running a software implementation of the present invention.

FIG. 9 illustrates, in block diagram form, a general purpose computer 50 in accordance with one embodiment of the present invention which may be used to execute the methods discussed herein. General purpose computer 50 includes a computer processor 52 and memory 54 coupled by a bus 56. Memory 54 may include relatively high speed machine readable media such as DRAM, SRAM, ROM, FLASH, EEPROM, bubble memory, etc. Also coupled to bus 56 are secondary storage 58, external storage 60, output devices such as a monitor 64, input devices such as a keyboard (with mouse) 66, and printers 68. Secondary storage 58 may include machine readable media such as hard disk drives, magnetic drum, bubble memory, etc. External storage 60 may include machine readable media such as floppy disks, removable hard drives, magnetic tap, CD-ROM, and even other computers, possibly connected via a communications line. It should be appreciated that there may be overlap between some elements, such as between secondary storage 58 and external storage 60. Executable versions of computer software 62, such as, for example, software for performing the layout generation described herein, can be written to, and later read from external storage 60, loaded for execution directly into memory 54, or stored on secondary storage 58 prior to loading into memory 54 and execution. Also, the transistor layers may be stored in secondary storage 58 or external storage 60.

Various changes and modifications to the embodiments herein chosen for purposes of illustration will readily occur to those skilled in the art. For example, variations in the types of conductivities of transistors, the types of transistors, etc. may be readily made. Although specific logic circuits have been shown, numerous logic circuit implementations may be used to implement the functions discussed herein. To the extent that such modifications and variations do not depart from the spirit of the invention, they are intended to be included within the scope thereof which is assessed only by a fair interpretation of the following claims.

What is claimed is:

1. A method for converting a planar transistor design to a vertical double-gate transistor design, comprising:
   providing a planar transistor layout corresponding to the planar transistor design having a gate layer overlying an active layer;
   defining a first intermediate layer based on an overlapping region of the gate layer and the active layer;
   using the first intermediate layer to define a second intermediate layer, the second intermediate layer or defining a spacing between at least two fins of the vertical double-gate transistor design; and
   defining a resulting layer based on a non-overlapping region of the second intermediate layer and the active layer, the resulting layer for use in creating at least a portion of a mask corresponding to the vertical double-gate transistor design.

2. The method of claim 1, wherein defining the first intermediate layer based on the overlapping region of the gate layer and the active layer comprises performing an AND function between the gate layer and the active layer to define the first intermediate layer.

3. The method of claim 1, wherein defining the resulting layer based on a non-overlapping region of the second intermediate layer and the active layer comprises performing an XOR function between the second intermediate layer and the active layer.

4. The method of claim 1, further comprising:
   prior to using the first intermediate layer to define the second intermediate layer, modifying a dimension of the first intermediate layer.

5. The method of claim 4, wherein modifying the dimension of the first intermediate layer comprises increasing at least one of a length or width of the first intermediate layer by a predetermined amount.

6. The method of claim 5 wherein modifying the dimension of the first intermediate layer comprises increasing the length and the width of the first intermediate layer by the predetermined amount.

7. The method of claim 1, wherein the second intermediate layer further defines a length of the at least two fins, wherein the length is greater tan a length of the gate layer in the overlapping region of the gate layer and the active layer.

8. The method of claim 7, wherein the second intermediate layer further defines a width of the at least two fins.

9. The method of claim 1, wherein the at least one intermediate layer further defines a length of the at least two fins, wherein the Length is greater than a length of the gate layer in the overlapping region of the gate layer and the active layer.

10. The method of claim 9, wherein the at least one intermediate layer further defines a width of the at least two fins.

11. The method of claim 1, further comprising:
    providing a semiconductor substrate; and
    using the mask to create a semiconductor device overlying the semiconductor substrate, the semiconductor device comprising a vertical double-gate transistor corresponding to the vertical double-gate transistor design.

12. A method for converting a planar transistor design to a vertical double-gate transistor design, comprising:
  providing a planar transistor layout corresponding to the planar transistor design having a gate layer overlying an active layer;
  performing an AND function between the gate layer and active layer to define a first intermediate layer;
  defining a second intermediate layer based on the first intermediate layer, the second intermediate layer defining a spacing between at least two fins of the vertical double-gate transistor design; and
  performing an XOR function between the second intermediate layer and the active layer to define a resulting layer, the resulting layer for use in creating at least a portion of a mask corresponding to the vertical double-gate transistor design.

13. The method of claim 12, further comprising:
  providing a semiconductor substrate; and
  using the mask to create a semiconductor device overlying the semiconductor substrate, the semiconductor device comprising a vertical double-gate transistor corresponding to the vertical double-gate transistor design.

14. The method of claim 12, further comprising:
  prior to using the first intermediate layer to define the second intermediate layer, performing an oversize function on the first intermediate layer.

15. The method of claim 14, wherein performing the oversize function comprises increasing at least one of a length or width of the first intermediate layer by a predetermined amount.

16. The method of claim 12, wherein the second intermediate layer further defines a length of the at least two fins, wherein the length is greater than a length of the gate layer in the overlapping region of the gate layer and the active layer.

17. The method of claim 16, wherein the second intermediate layer further defines a width of the at least two fins.

18. A method for converting a planar transistor design to a vertical double-gate transistor design stored via a computer readable medium, said computer readable medium comprising:
  a first set of instructions for receiving a planar transistor layout corresponding to the planar transistor design having a gate layer overlying an active layer;
  a second set of instructions for defining a first intermediate layer based on an overlapping region of the gate layer and the active layer;
  a third set of instructions for using the first intermediate layer to define a second intermediate layer, the second intermediate layer for defining a spacing between at least two fins of the vertical double-gate transistor design; and
  a fourth set of instructions for defining a resulting layer based on a non-overlapping region of the at least one intermediate layer and the active layer, the resulting layer for use in creating at least a portion of a mask corresponding to the vertical double-gate transistor design.

* * * * *

UNITED STATES PATENT AND TRADEMARK OFFICE
CERTIFICATE OF CORRECTION

PATENT NO. : 7,013,447 B2  Page 1 of 1
APPLICATION NO. : 10/624398
DATED : March 14, 2006
INVENTOR(S) : Leo Mathew It is certified that error appears in the above-identified patent and that said Letters Patent is hereby corrected as shown below:

In Column 4, Line 18, Claim No. 1:

Change "or" to --for--

In Column 4, Line 50, Claim No. 7:

Change "tan" to --than--

In Column 4, Line 56, Claim No. 9:

Change "Length" to --length--

Signed and Sealed this

Twentieth Day of March, 2007

JON W. DUDAS
*Director of the United States Patent and Trademark Office*